US008467722B2

(12) United States Patent
Spector

(10) Patent No.: US 8,467,722 B2
(45) Date of Patent: Jun. 18, 2013

(54) THEMED ORNAMENTS WITH WIFI AND WIMAX STREAMING STATIONS

(76) Inventor: Donald Spector, New York, NY (US)

( * ) Notice: Subject to any disclaimer, the term of this patent is extended or adjusted under 35 U.S.C. 154(b) by 27 days.

(21) Appl. No.: 13/331,469

(22) Filed: Dec. 20, 2011

(65) Prior Publication Data

US 2012/0094592 A1 Apr. 19, 2012

Related U.S. Application Data

(63) Continuation-in-part of application No. 12/180,901, filed on Jul. 28, 2008, now Pat. No. 8,099,039.

(60) Provisional application No. 60/954,879, filed on Aug. 9, 2007.

(51) Int. Cl.
*H04H 40/00* (2008.01)
*H05K 11/00* (2006.01)

(52) U.S. Cl.
USPC .......................... 455/3.06; 455/344; 455/347

(58) Field of Classification Search
USPC .......... 455/3.01, 3.06, 39, 90.3, 575.1, 575.8, 455/344, 347
See application file for complete search history.

(56) References Cited

U.S. PATENT DOCUMENTS

| | | | | |
|---|---|---|---|---|
| 7,003,515 | B1 | 2/2006 | Glaser et al. | |
| 7,065,342 | B1 | 6/2006 | Rolf | |
| 7,817,591 | B2 | 10/2010 | Cooley | |
| 7,873,040 | B2 | 1/2011 | Karlsgodt | |
| 2004/0198175 | A1 | 10/2004 | Shively et al. | |
| 2006/0168097 | A1 | 7/2006 | Pittelli | |
| 2008/0194175 | A1 | 8/2008 | Last et al. | |
| 2010/0042920 | A1 * | 2/2010 | Sigal | 715/704 |

* cited by examiner

*Primary Examiner* — Sonny Trinh
(74) *Attorney, Agent, or Firm* — Collard & Roe, P.C.

(57) ABSTRACT

An apparatus for playing signals received from the internet or other information highway on one or more speakers are described. The apparatus has a receiver for receiving information from a preselected address; a processor for interpreting the signals; a user interface for choosing between a connection to a personal computer and the preselected address; and at least one sound emitting device for playing the processed signal. The apparatus has an ornamental design on the outside which is related to the topic of the signals received from the address.

7 Claims, 5 Drawing Sheets

THEMED ORNAMENTS WITH WIFI AND WIMAX STREAMING STATIONS

CROSS REFERENCE TO RELATED APPLICATIONS

This application is a continuation-in-part under 35 U.S.C. §120 of U.S. patent application Ser. No. 12/180,901 filed Jul. 28, 2008, which claims the benefit of priority under 35 U.S.C. §119(e) to U.S. Provisional Patent Application Ser. No. 60/954,879, filed Aug. 9, 2007, the entirety of which is hereby incorporated by reference.

BACKGROUND OF THE INVENTION

This application relates to the field of internet receivers that are capable of receiving Internet radio signals. More specifically, this application relates to themed ornamental designs or toys that relate to a specific station that is received through these devices by Wi-Fi or Wi-Max. It is also noted that one Wi-Fi or Wi-Max Internet receiver may be used to supply signal to multiple ornamental devices, thereby bringing down the cost of a specific ornament in the future. The device or toy can also be wirelessly connected to a computer with a digital library stored thereon, and selections from the library can be played by the device as well.

Internet Radio Stations are easy to broadcast and with Wi-Fi and Wi-Max can be transmitted to virtually every part of the world. In fact, the problem is that so many stations are available on the Internet that it is hard for them to get traction. It is hard for those stations to get traffic even when they have been "selected" for AOL Radio or another "brand" name. Therefore, there is a need in the art for an Internet Radio player which can help an Internet Radio Station gain market share. In addition, it would be desirable for the user to be able to program desired selections within the selected station, using the device, so that programming matching the user's preferences is broadcast to the device.

SUMMARY OF THE INVENTION

The present invention relates to an Internet Radio receiver having an ornamental design that is related to a topic. The ornamental design may be of any number of topics, and could be a toy, such as a stuffed animal. By way of example, the ornamental design may be the Vatican, Magic Kingdom, Yankee Stadium or even a more generic figure (such as Santa Claus). In accordance with one or more embodiment, these "radios" are capable of picking up multiple Internet Radio stations. In detailed embodiments, the radio would refer back to an Internet Station that was serviced by the Vatican, Disney or a company that promoted Christmas Music, for example. In a preferred embodiment, the Internet Station can be programmed based on the user's preferences, so that only selections that coincide with the user's preferences are played. This can be accomplished according to the method described in U.S. Pat. No. 7,003,515, the disclosure of which is herein incorporated by reference.

When the device is turned on, it may be programmed to automatically broadcast events related to the product it represents. The ornament could relate to a well known actor, sports figure, animal, well as a location. These physical objects help the Internet Station get traction and thereby help increase the number of listeners. Furthermore, because they are "displayed" as either toys or artwork (like ceramic pieces) they tend to come to the mind of the consumer more and therefore their initial cost could be subsidized by those who sold advertising on the Internet Station and want to reach a very specific demographic. For example, if the ornament is a stuffed bear, the radio station may be related to children's music or stories. A video player may also be incorporated into the ornament, to stream theme-related movies or television shows as well.

One or more embodiments of the invention are directed to apparatus for playing signals received from the internet or other information highway on one or more speakers or sound emitting devices. The apparatus can comprise a receiver that connects to the internet or other information highway. A processor is included in the receiver that connects to an address on the internet or other information highway. A connection to which the one or more speakers or sound emitting devices can be connected to play signals received from the preselected address on the internet or other information highway is provided. In addition, the apparatus is also configured to connect to a personal computer. The computer can store additional content that is also related to the theme of the ornament. The device can have a means for overriding the streaming radio and switching to a selected song or story from the computer as well. The computer has software that allows the user to create a play list of the selected songs or stories, which can then be played by the device.

The outside of the apparatus has an ornamental design related to the topic of the signals received from the address on the internet or other information highway. In detailed embodiments, the address may be pre-programmed into the apparatus.

The receiver can be wirelessly connected on its own to the internet or other information highway. Other aspects have suitable apparatus such as a router to connect the receiver to the internet or other information highway using Wi-Fi or Wi-Max technology. Any connection to the internet, however, can be used.

The apparatus has a processor that connects to one of a plurality of preselected addresses on the internet or other information highway. The apparatus also has an interface for selecting the one of the plurality of preselected addresses, as well as an interface for entering the user's preferences regarding the selection being played. In one embodiment, there is a button on the device for indicating that the user likes the selection, and an other button for indicating that the user does not like the selection. The radio then defaults to selections that most closely match the input preferences of the user.

The ornamental design of some embodiments may represent any known entity, place, thing, etc. For example, it can be selected from the group consisting of: a theme park attraction; a sports stadium, and a religious site. The ornamental design of the apparatus may be a representation of an edifice, a character, an animal, a piece of art or other similar representation. According to some aspects, the apparatus may default to an internet radio station which is correlated with the ornamental design when power is supplied to the apparatus and transmits signals related to a preselected topic.

In other aspects, the speakers may be physically connected to the apparatus or wirelessly to the wireless connection.

DETAILED DESCRIPTION

As used in this specification and the appended claims, the singular forms "a", "an" and "the" include plural referents unless the context clearly indicates otherwise. Thus, for example, reference to "a radio" includes a combination of two or more radios, and the like.

As used in this specification and the appended claims, "internet" refers not only to the internet, but also to any wide area network or local area network. Use of the term "internet" is not intended to limit the present invention to communications received via the world wide web.

As used in this specification and the appended claims, "pre-selected" means that the internet radio address, or URL, has been programmed into the radio. The pre-selected address may be a default address, or a selection of addresses to which the user can set the radio to default.

As used in this specification and the appended claims, a "speaker" means any sound emitting device and is not limited to standard electromechanical transducer type speakers. Non-limiting examples of suitable speakers are piezoelectric speakers, electrostatic speakers, flat panel speakers and digital speakers.

Figure 1:
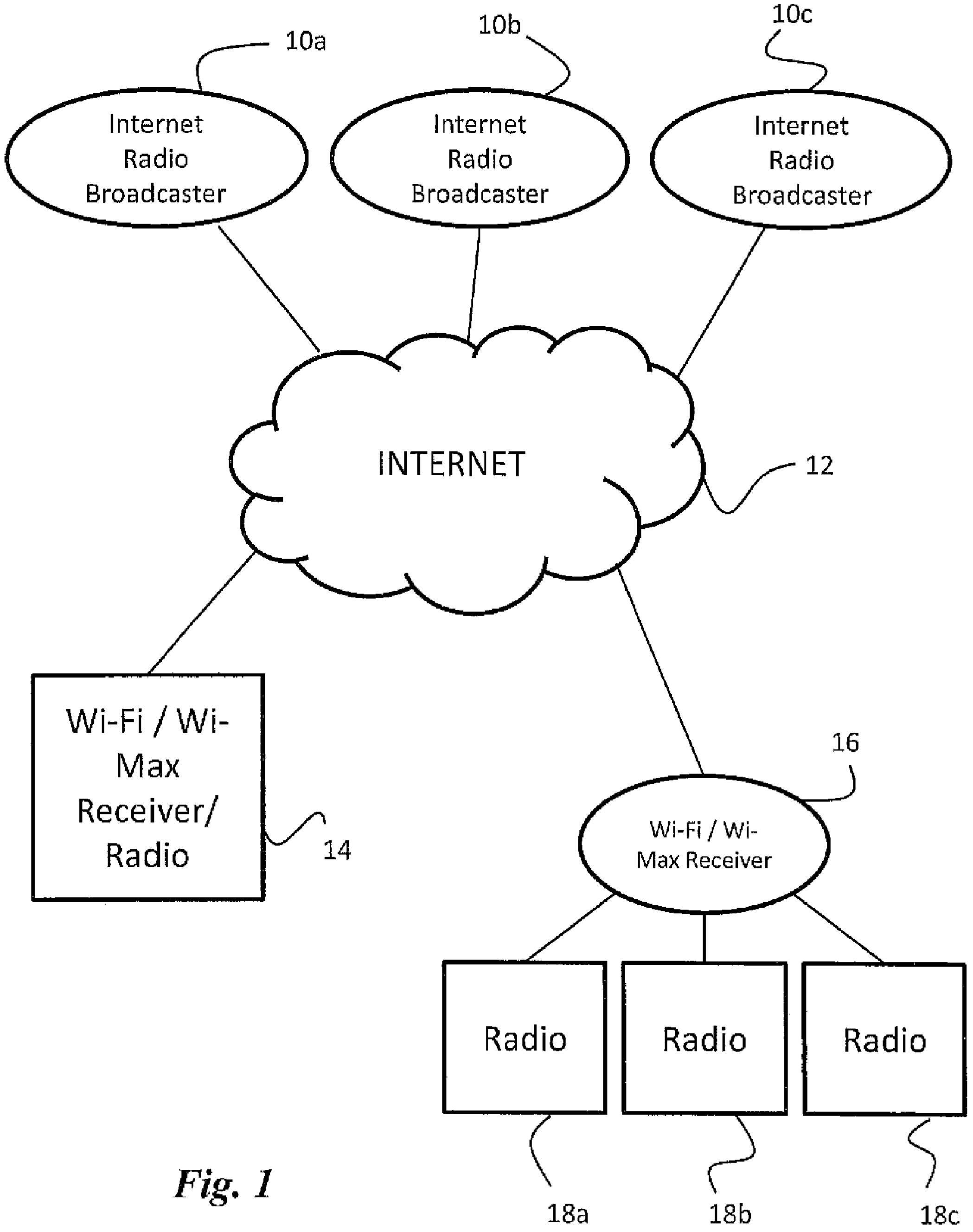
FIG. 1 illustrates a block diagram of an Internet Radio broadcast receiving station.

Referring to FIG. 1, one or more Internet Radio Broadcasters 10*a*, 10*b* and 10*c*, provide electronic signals through the internet 12. The signals can be received by a combination Wi-Fi/Wi-Max receiver/radio 14 or individual receivers 16. If an individual receiver is employed, at least one separate radio 18*a*, 18*b* and 18*c* would be needed to provide audio output.

The signal must be interpreted before it can be played on the radio. This interpretation can be performed by either the receiver or the radio depending on the desired configuration. For example, the receiver 16 may be placed in an office building. The receiver 16 may interpret the electronic signals, generating signals that can be played directly by the radio 18. This would allow a plurality of radios to be placed around the office building which would all play the same received signal.

The Internet Radio Broadcaster could also be a local broadcast which might be transmitted as a signal containing, for example, elevator music. The signal could be transmitted to a network with limited receivership. For example, an in-house radio station could transmit over a local area network which can only be received and interpreted by devices connected to that local area network.

Accordingly, one or more embodiments of the invention are directed to apparatuses for playing signals received from the internet or other information highway on one or more speakers. The apparatus comprises a receiver that connects to the internet or other information highway. A processor is included in the receiver that connects to a preselected address on the internet or other information highway. A connection to which the one or more speakers can be connected to play signals received from the preselected address on the internet or other information highway. The outside of the receiver has an ornamental design related to the topic of the signals received from the preselected address on the internet or other information highway.

Some aspects of the invention wirelessly connect the receiver to the internet or other information highway. Other aspects have suitable apparatus to connect the receiver to the internet or other information highway using Wi-Fi or Wi-Max technology.

Detailed embodiments of the invention have a processor that connects to one of a plurality of preselected addresses on the internet or other information highway. The apparatus also has an interface for selecting the one of the plurality of preselected addresses. Another aspect has a plurality of ornamental designs on the apparatus. Each of the ornamental designs may be related to a topic on each of the plurality of preselected addresses.

The ornamental design of some embodiments may be selected from the group consisting of: a theme park attraction; a sports stadium, and a religious site. The ornamental design of the apparatus may be a representation of an edifice, a character, a piece of art or other similar representation. According to some aspects, the apparatus may default to an internet radio station which is correlated with the ornamental design when power is supplied to the apparatus.

In other aspects, the speakers may be physically connected to the apparatus or wirelessly to the wireless connection.

Further aspects of the invention have a preselected address on the internet which transmits signals related to a preselected topic. The topic can be, for example, religious, sports related or educational in nature.

Figure 2:
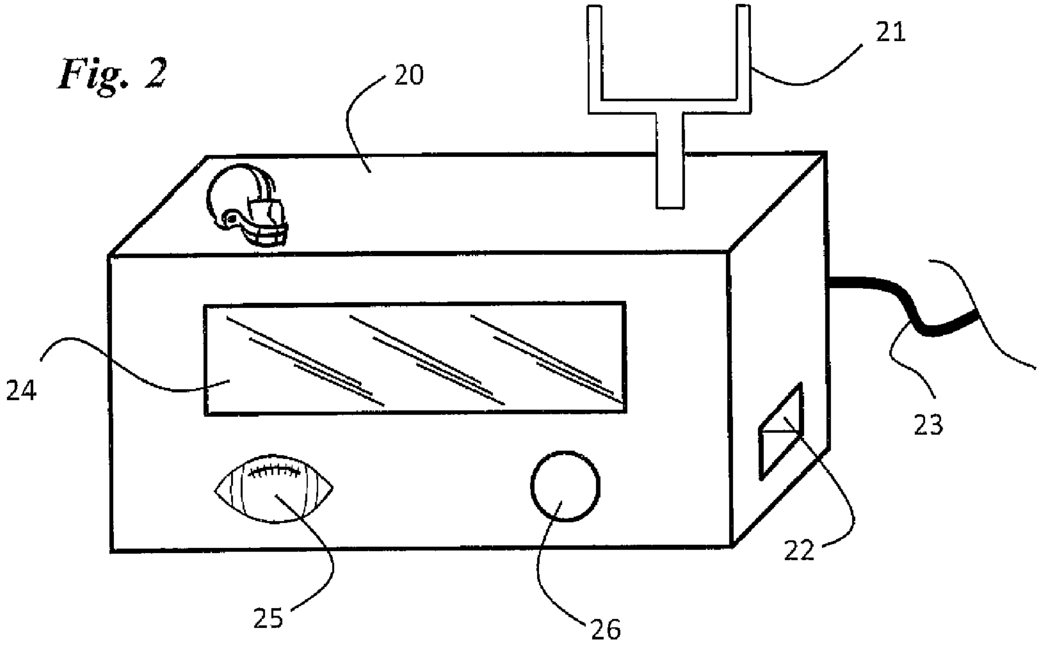
FIG. 2 illustrates an Internet Radio in accordance with one aspect of the present invention.

FIG. 2 shows a radio 20 according to one or more embodiments of the invention. The radio 20 shown has an ornamental design related to football. The user can supply power to the radio be either connection of a power cord 23 to a standard power outlet or by battery power (not shown). Any buttons and dials on the radio can be shaped in accordance with the ornamental design. For example, the user may power the radio 20 by pressing a power button 25, shown as a football shaped button.

The radio 20 may be, but does not need to be, preprogrammed with a specific internet radio station which will act as a default station related to the ornamental design. Here, the radio 20 may tune to an internet radio station associated with the National Football League, or a station that broadcast college football games. The user may be able to connect the radio 20 to a computer (not shown) to add additional internet radio stations. Alternatively, the radio 20 may have buttons or controls (not shown) to allow additional internet radio station URLs to be added.

Once powered, the radio 20 might be designed to broadcast the default internet radio station. The radio 20 can access the internet wirelessly using a wireless antenna 21, which can be shaped according to the ornamental design. Additionally, the radio 20 can be connected to the internet through a wired connection 22 using, for example, an Ethernet connection to a computer or an internet appliance, USB, IEEE-1394, serial, parallel, or any other suitable connection.

The radio 20 has a screen 24 which can display information related to the internet radio station that is being broadcast. For example, the URL, name of the radio station, or song/program specific information can be displayed. The display 24 may not be needed if the radio is locked into a specific internet radio station. The user may tune the station by turning or pressing a tuning dial 26, shown as a normal dial but could also be ornamental in accordance with the overall design.

Figure 3:
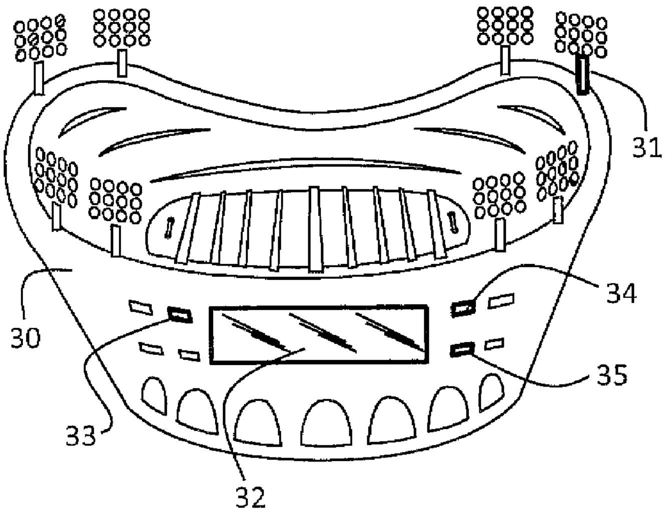
FIG. 3 illustrates another aspect of the Internet Radio in accordance with the present invention.

FIG. 3 shows a radio 30 according to other embodiments of the invention. Here, the radio 30 has the physical shape of a sports arena. A wireless antenna 31 is incorporated into the design as part of the sports arena lighting. The display 32, if needed, can also be incorporated into the design, here as windows on the arena. The display 32 could alternatively be shaped and located as a scoreboard within the arena. The power button 33 and tuning buttons 34, 35 can also be incorporated as components of the ornamental design. Upon powering the radio 30 using the power button 33, the radio 30 would default to a station associated with the ornamental design. Here, it may tune to a sports station. The station may be changeable by pressing the tuning buttons 34, 35 to select a number of pre-programmed radio stations. The radio 30 may also be connectable to a computer through any suitable connection (not shown) allowing the user to program additional stations into the radio 30.

Figure 4:
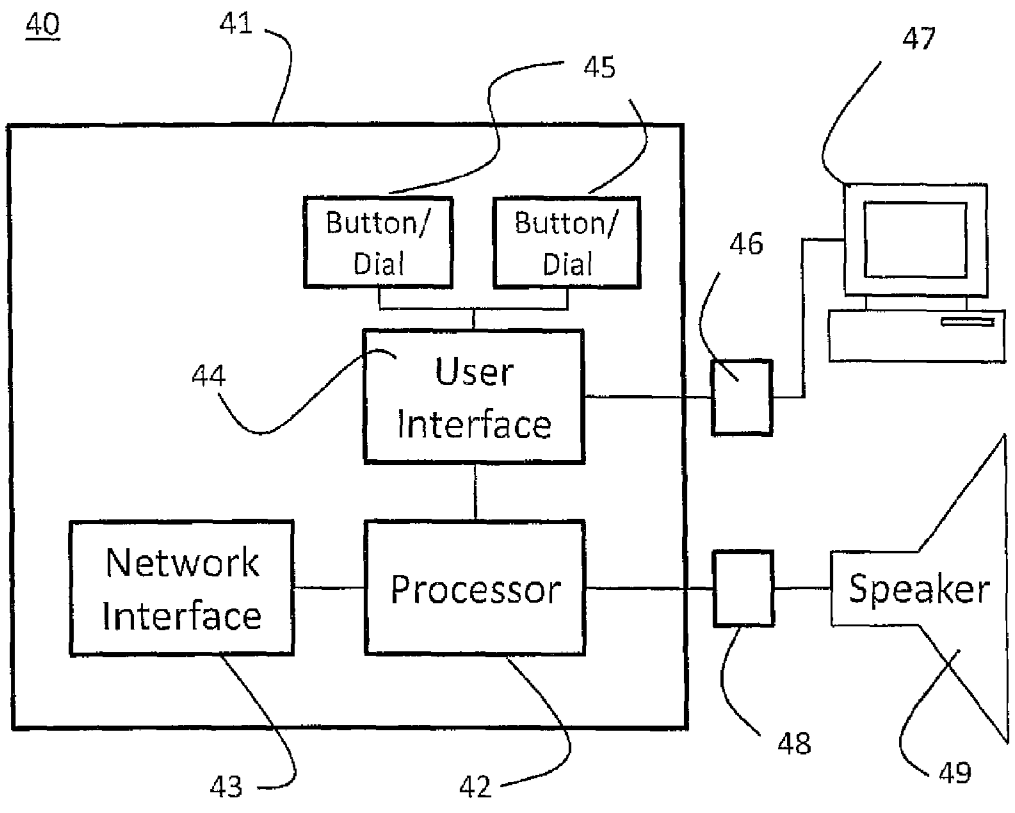
FIG. 4 illustrates a block diagram schematic of an Internet Radio.

FIG. 4 shows a block diagram schematic of an internet radio 40 according to one or more embodiments of the invention. The housing 41 containing the internet radio components can have an ornamental design. A processor 42 contained within the housing 41 is coupled to a network interface 43. The network interface 43 can be a wireless connection or a wired connection.

The internet radio 40 may include a user interface 44 which interacts with the processor 42 to provide accessible controls for a user. The user interface 44 may have a series of buttons or dials 45 for making adjustments (i.e., change stations or volume) to the internet radio 40. Additionally, the user interface 44 could incorporate a connection 46 which would allow the internet radio 40 to be attached to a personal computer 47. By way of example, the housing 41 may be connected to the personal computer 47 by a USB or wireless connection. Software running on the personal computer 47 can allow greater control over the functions of the internet radio 40. For example, the software may allow the user to add additional internet radio stations to the internet radio 40 which can then be accessed by the user interface 44.

The housing 41 may also have an audio connector 48 attached to the processor 42. This audio connector 48 can be any type of interface which would enable an audio signal to be transmitted from the processor 42 to a speaker 49. For example, standard speaker wire could be employed. Additionally, the audio interface 48 may be a wireless interface (i.e., infrared transmission) which can be received by suitable apparatus in the speaker 49. The speaker 49 can be located remotely from the housing 41, or within the housing 41. Where the speaker 49 is located remotely from the housing 41, the speaker may also have an ornamental design. The speaker may also have controls to provide power and volume control (not shown).

Figure 5:
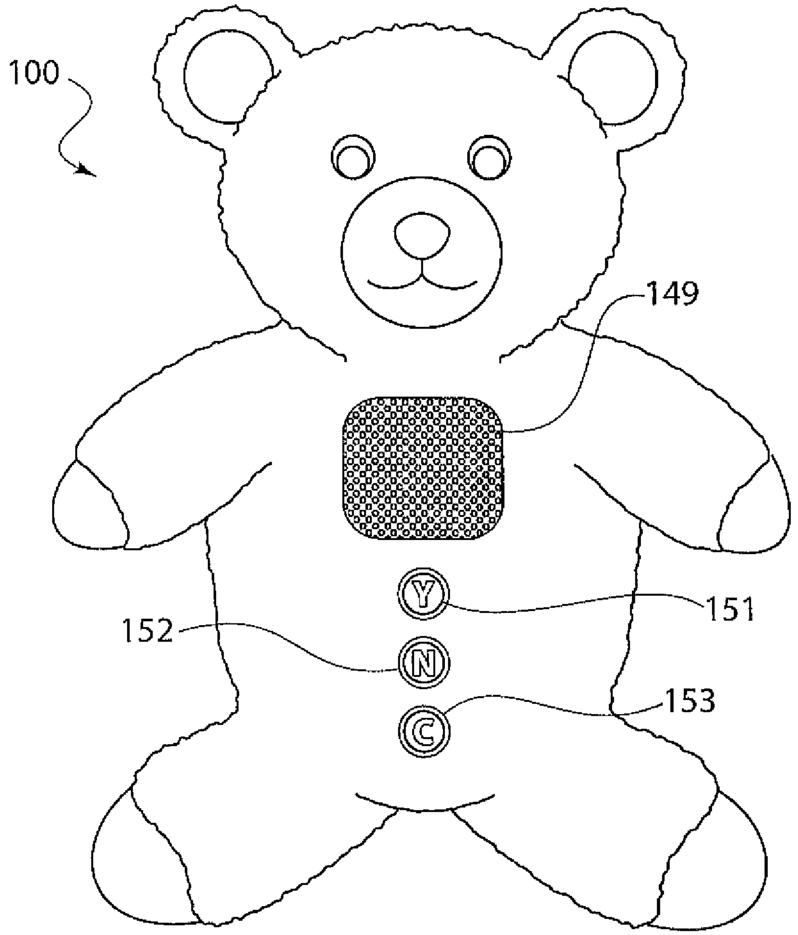
FIG. 5 shows an alternative embodiment of Internet Radio in accordance with the Invention.
Figure 6:
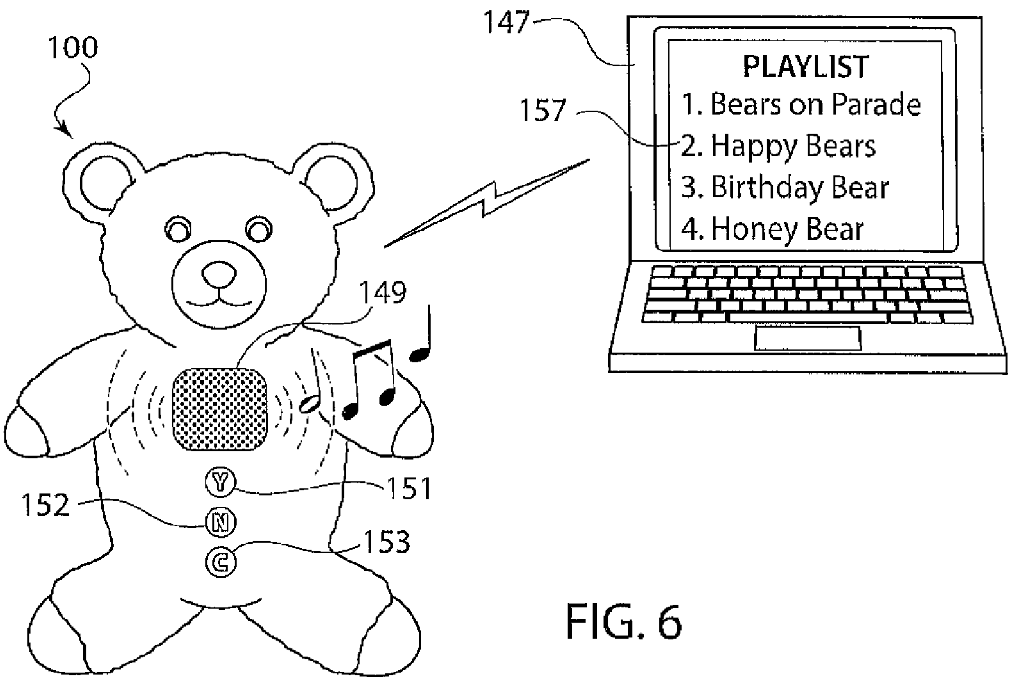
FIG. 6 shows the Internet Radio in communication with a personal computer.
Figure 7:
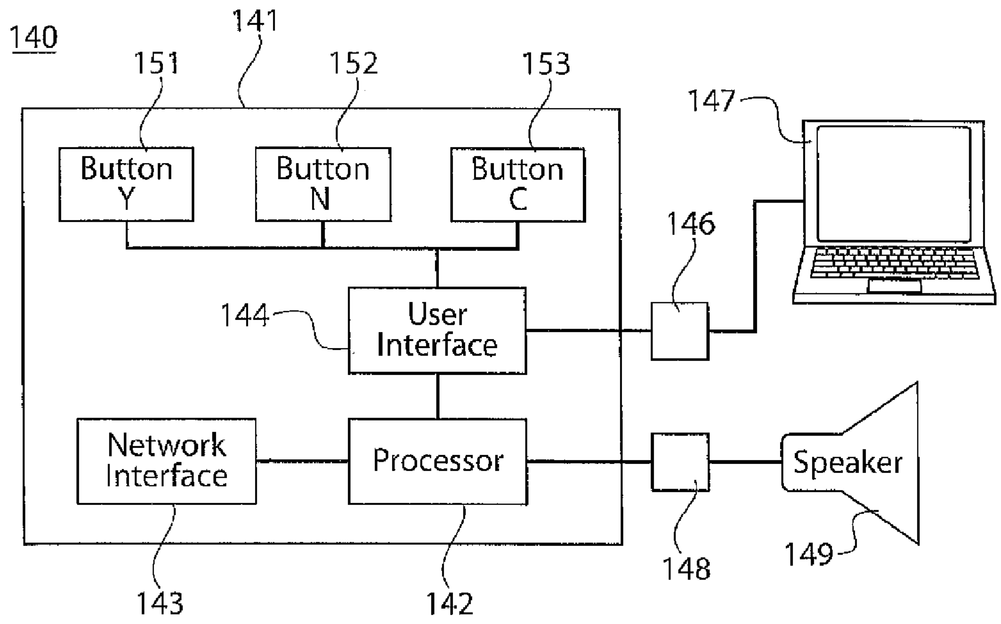
FIG. 7 shows a block diagram of the components of the Interned Radio of FIGS. 5 and 6.

FIGS. 5-7 show another alternative embodiment of the invention. Here, the internet radio takes the form of a stuffed bear 100. Bear 100 has an internet radio 140 inside of it, which plays music and other programming through speaker 149.

Internet radio 140 is shown schematically in FIG. 7. Radio receiver 140 comprises a processor 142 contained within the housing 141 is coupled to a network interface 143. The network interface 143 can be a wireless connection or a wired connection.

The internet radio 140 may include a user interface 144 which interacts with the processor 142 to provide accessible controls for a user. The user interface 144 has a series of buttons 151, 152 and 153 to control the content being played. Buttons 151 and 152 allow the user to input his/her music preferences to control the content being broadcast through bear 100. Button 151, labeled Y, indicates that the user likes the particular program being broadcast, which instructs the internet radio station to play more programs that are similar. Button 152, labeled "N", indicates that the user does not like the program being played, which then instructs the internet radio station to avoid broadcasting similar programs to the user. This way, the user can "train" the internet radio station as to his/her likes and dislikes regarding the selected programming.

User interface 144 could incorporate a connection 146 which would allow the internet radio 140 to be attached to a personal computer 147. By way of example, the housing 141 may be connected to the personal computer 147 by a USB or wireless connection. Software running on the personal computer 147 allows the user to create a playlist 151, as shown in FIG. 6, which organizes music or other content stored on computer 147, and have playlist 151 be played on radio 140. Selecting button 153, labeled "C" on bear 100, allows the user to switch from the internet radio signals being played to the selected playlist 151 from the content stored on the computer 147. Selecting button 151 again then switches the broadcast back to the internet radio. The internet radio 140 is preprogrammed to default to an internet radio station that coincides with the theme of the ornament, which in this case is a stuffed bear 100. For example the internet radio station could be one that tells children's stories or plays children's music. The Y and N buttons allow the child to customize the radio station even further by entering his/her preferences about the content.

The housing 141 has an audio connector 148 attached to the processor 142. This audio connector 148 can be any type of interface which would enable an audio signal to be transmitted from the processor 142 to a speaker 149. For example, standard speaker wire could be employed. Additionally, the audio interface 148 may be a wireless interface (i.e., infrared transmission) which can be received by suitable apparatus in the speaker 149. The speaker 149 is located within housing 141, but could also be located remotely. Where the speaker 149 is located remotely from the housing 141, the speaker may also have an ornamental design. The speaker may also have controls to provide power and volume control (not shown).

The various embodiments and aspects of the invention described here can be employed individually or in conjunction with other embodiments and aspects. Descriptions of individual aspects and embodiments does not preclude the inclusion of other aspects, embodiments or additional structural components.

It is to be understood that the invention is not limited to the details of construction or process steps set forth in the following description. The invention is capable of other embodiments and of being practiced or being carried out in various ways.

While there have been shown, described and pointed out fundamental novel features of the invention as applied to preferred embodiments or aspects thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

What is claimed is:

1. An apparatus for playing signals received from the internet or other information highway on one or more speakers, comprising:

a receiver that connects to the internet or other information highway;

a processor in the receiver that connects to a address on the internet or other information highway;

a connection to which the one or more sound emitting device can be connected to play signals received from the preselected address on the internet or other information highway;

a connection to a personal computer;

a user interface that allows the user to switch the sound emitting device from playing signals received from the internet of other information highway to signals from the personal computer; and an ornamental design on the apparatus that is related to the topic of the signals received from the address on the internet or other information highway.

2. The apparatus of claim 1, wherein the receiver wirelessly connects to the internet or other information highway.

3. The apparatus of claim 1, wherein the receiver wirelessly connects to the internet or other information highway via a one of a Wi-Fi connection, Wi-Max connection or a microwave connection.

4. The apparatus of claim 1, wherein the interface has a button connected to the processor, wherein pressing the button communicates to the radio station that the user likes the signals being broadcast.

5. The apparatus of claim 4, wherein the interface has another button connected to the processor, wherein pressing said another button communicates to the radio station that the user does not like the signals being broadcast.

6. The apparatus of claim 1, wherein the ornamental design is selected from the group consisting of: a piece of art, an animal, a character from a book or movie, a theme park attraction; a sports stadium, and a religious site.

7. The apparatus of claim 1, wherein the one or more speakers are connected to the connection and are physically connected to the apparatus.

* * * * *